US007659475B2

(12) United States Patent
Agostinelli et al.

(10) Patent No.: US 7,659,475 B2

(45) Date of Patent: Feb. 9, 2010

(54) METHOD FOR BACKSIDE SURFACE PASSIVATION OF SOLAR CELLS AND SOLAR CELLS WITH SUCH PASSIVATION

(75) Inventors: Guido Agostinelli, Brussels (BE); Jozef Szlufcik, Wilsele (BE); Petko Vitanov, Sofia (BG); Antoaneta Harizanova, Sofia (BG)

(73) Assignee: IMEC, Leuven (BE)

( * ) Notice: Subject to any disclaimer, the term of this patent is extended or adjusted under 35 U.S.C. 154(b) by 645 days.

(21) Appl. No.: 10/871,531

(22) Filed: Jun. 17, 2004

(65) Prior Publication Data

US 2005/0022863 A1 Feb. 3, 2005

(30) Foreign Application Priority Data

Jun. 20, 2003 (EP) .................................. 03447168
Jan. 27, 2004 (GB) ................................ 0401703.4

(51) Int. Cl.
*H01L 31/00* (2006.01)

(52) U.S. Cl. ....................... 136/256; 136/251; 136/258; 136/259; 136/261; 257/433; 257/788; 257/E21.266; 257/E21.268; 257/E21.271; 257/E21.28; 257/E21.29; 428/457; 438/38

(58) Field of Classification Search ......... 136/258–259, 136/261, 256, 251; 257/433, 788, E21.266, 257/E21.268, E21.271, E21.28–E21.29; 438/38, 438/57; 428/457

See application file for complete search history.

(56) References Cited

U.S. PATENT DOCUMENTS 3,767,463 A * 10/1973 Aboaf et al. ................ 257/645
4,463,216 A * 7/1984 Nakano et al. .............. 136/256
4,525,593 A * 6/1985 Yablonovitch .............. 136/255
4,828,628 A * 5/1989 Hezel et al. ................. 136/255

(Continued)

FOREIGN PATENT DOCUMENTS

EP 1173047 A1 * 1/2002

OTHER PUBLICATIONS

Hernandez et al., "Evolution of the Texture and Structure of SiO2-AI203 Xerogels and Aergels as a Function of the Si to Al Molar Ratio", Journal of Sol-Gel Science and Technology, vol. 20, pp. 227-243, 2001.*

(Continued)

*Primary Examiner*—Basia Ridley
*Assistant Examiner*—Thanh-Truc Trinh
(74) *Attorney, Agent, or Firm*—Knobbe Martens Olson & Bear LLP

(57) ABSTRACT

The present invention provides a method for dielectric passivating the surface of a solar cell by accumulation of negative fixed charges of a first type at the interface between semiconductor material and a passivating material. According to the invention the passivating material comprises an oxide system, for example a binary oxide system, comprising $Al_2O_3$ and at least one metal oxide or metalloid oxide which enhances the tetrahedral structure of $Al_2O_3$, for example, an $(Al_2O_3)_x(TiO_2)_{1-x}$ alloy. In this way it is possible to combine the desirable properties from at least two different oxides, while eliminating the undesirable properties of each individual material. The oxide system can be deposited onto the semiconductor surface by means of a sol-gel method, comprising the steps of formation of the metal oxide and/or metalloid oxide sol and the aluminum solution and then carefully mixing these together under stirring and ultrasonic treatment. Thin films of the oxide system can then be deposited onto the semiconductor surface by means of spin coating followed by a temperature treatment.

29 Claims, 8 Drawing Sheets

Capacitance [pF] (0–600) vs. Voltage [V] (-3 to 3)
$Al_2O_3$ deposited on 2 p-Si
Hg probe
sol-gel $(Al_2O_3)_x(TiO_2)_{1-x}$

U.S. PATENT DOCUMENTS 4,842,888 A * 6/1989 Haluska et al. ............. 428/688
6,660,578 B1 * 12/2003 Karlsson et al. ............. 438/199

OTHER PUBLICATIONS

Wilk et al.; J. Appl. Physics, vol. 89, No. 10, pp. 5243-5275 (2001); "High-k gate dielectrics: Current status and materials properties considerations.".

Mandelkom, et al.; J. Appl. Phys., vol. 44, No. 10, pp. 4785-4787 (1973); "A new electric field effect in silicon solar cells".

Lukovsky et al.; Proc. of the Characterisation and Metrology for USLI Technology, pp. 154-158 (2000); "Minimization of Mechanical and Chemical Strain at Dielectric-Semiconductor and Internal Dielectric Interfaces in Stacked Gate Dielectrics for Advanced CMOS Devices".

Vitanov et al., "Application of $(Al_2O_3)_x(TiO_2)_{1-x}$ layers in solar cell technology," 20th European Photovoltaic Solar Energy Conference, Jun. 6-10, 2005, Barcelona, Spain, pp. 1399-1402.

* cited by examiner

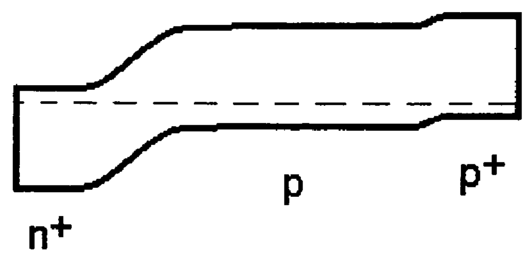
Fig. 1a
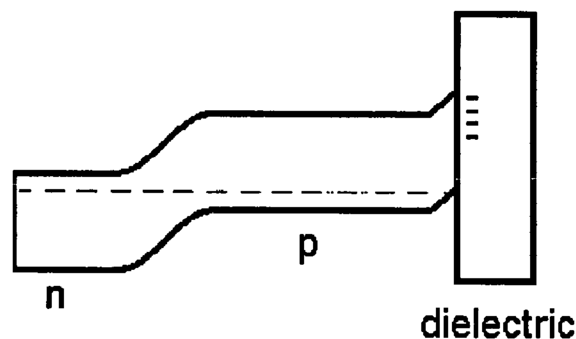
Fig. 1.b
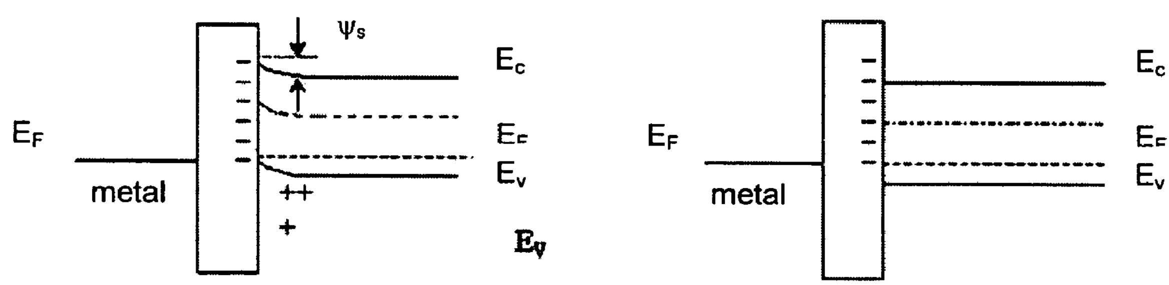
Fig. 2a
Fig. 2b

METHOD FOR BACKSIDE SURFACE PASSIVATION OF SOLAR CELLS AND SOLAR CELLS WITH SUCH PASSIVATION

FIELD OF THE INVENTION

The present invention relates to semiconductor, for example, silicon, solar cells, and more particularly to a method for passivation of the semiconductor substrate surface, for example, silicon surface, of a solar cell by a dielectric with negative fixed charge at the interface between the semiconductor substrate, for example, silicon, and a passivating dielectric.

BACKGROUND OF THE INVENTION

Solar cells convert impinging electromagnetic radiation, for example, sunlight directly into electrical energy. They are made of semiconducting materials which can be monocrystalline, polycrystalline or amorphous. This process of converting light (photons) to electrical energy (voltage) is called the photovoltaic (PV) effect. The performance of a solar cell is measured in terms of its efficiency at turning light energy into electrical energy.

To reduce costs it is advantageous to make solar cells with a small thickness of semiconductor material. In this case, the thickness can be so low that minority carriers will easily reach the back surface of the solar cell and will recombine there. Through this, a significant loss of energy occurs and only a small amount of the impinging sunlight is effectively converted into electrical energy. An alternative is to increase the thickness of semiconductor material with its cost disadvantages.

To create solar cells with good efficiency it is preferred that less energy is lost. Therefore, a layer, also called a back surface field (BSF) passivation layer, has been applied at the back side of the solar cell to stop recombination and to allow minority carriers to diffuse back to the junction formed by the interface between the semiconductor, for example, silicon, and the passivating layer, and to subsequently contribute to the cell's current. J. Mandel and J. Lamneck show in "A new electric field effect in silicon solar cells", J. Appl. Phys., vol. 44, N 10, p 4765, (1973) that it is the presence of a heavily doped $p^+$ region beneath the rear contact which gives rise to these beneficial effects. The $p^+$ region at the cell back results in injection of holes into the back of p-type silicon, creating a high density of holes at the boundary of the bulk. On the other side the $p^+$ region at the back constitutes a barrier to the movement of electrons to the back contact (FIG. 1*a*), and in this way a reduction in the rear surface recombination velocity is reached. This effect is still rather inappropriately referred to as the back surface field (BSF) effect. The use of a $p^+$ region requires an additional doping with acceptor-type impurities which means more technological steps and increased costs.

Another possibility is to employ surface passivation by a thin dielectric film, which has a big fixed charge of a first type, for example, a negative charge, at the dielectric/semiconductor interface (FIG. 1*b*). In that case an accumulation layer is formed on the semiconductor surface. The BSF effect is reached, similarly to the case with a $p^+$ region. Minority carriers having charges of a second type opposite to the first type are repelled and prevented from recombining. This can be done by depositing dielectrics which form a fixed charge of the first type on the dielectric/semiconductor interface. In that way a metal insulator semiconductor (MIS) structure is formed.

In FIG. 2*a* an energy band diagram of such an MIS structure is shown for a p-type semiconductor. With an MIS structure equilibrium is established when the Fermi levels are aligned. Fermi level alignment involves charge movement and since charge cannot move through the dielectric (insulator), an external connection between the semiconductor and the metal is necessary in order to allow equilibrium.

For real MIS structures the work function differences between the metal and semiconductor for p-type semiconductors is:

$$\Phi_{ms}=\Phi_m-(\chi+E_g/2+\Psi_B)$$

where $\Phi_m$ is the metal work function, $\chi$ is the semiconductor electron affinity, $E_g$ the band gap and $\Psi_B$ the bulk potential.

If the work function of the semiconductor is less than that of the metal, electrons will flow from the semiconductor to the metal since there are lower energy states available there. Charge is stored on both sides of the insulator and a voltage drop occurs across it.

In FIG. 3 the high frequency current-voltage (CV) curves for an ideal and a real MIS structure are shown, by means of a dashed and a full line respectively. For dielectrics with fixed negative charge $Q_f$ a positive applied voltage is required to obtain the flat-band condition (FIG. 2*b*) and the corresponding CV curve shifts to positive voltages (FIG. 3). When there is a fixed oxide charge $Q_f$ the voltage required to reach flat-band condition is:

$$V_{fb}=\Phi_{Dms}-Q_f/C_{ox}$$

where $C_{ox}$ is the measured capacitance in accumulation, i.e. in the state of the semiconductor where the concentration of majority carriers is higher than the concentration of dopant atoms. Accumulation occurs when one applies a voltage, which is less than the flatband voltage $V_{fb}$. Only a small amount of band bending is needed to build up the accumulation charge. The sign of the fixed charge is also important, as negative fixed charge correlates with a plus sign. Backside surface contacts are generally regions of high recombination velocity. In order to reduce this high recombination velocity, a passivation by a dielectric layer is used.

A first known passivation layer for a silicon semiconductor layer is a $SiO_2$ layer. It is known that $SiO_2$ has excellent passivation properties on silicon. This is based on proper surface termination, although it is known that $SiO_2$ accumulates positive charges at the interface.

Furthermore, $SiN_x$:H local BSF is used as passivation layer for silicon surfaces. This technology is often employed on development solar cells. It relies on field induced passivation, through the accumulation of a high density of positive charges at the interface with silicon. On p-silicon substrates this generates an inversion layer which acts as an induced floating junction, which has not the effect of BSF. A disadvantage of this solution is that it is costly and relatively elaborate.

Another possibility to solve the above problem has been described In WO 02/41408. In this document $AlF_3$+$SiO_2$ layers are used as passivation layers. This approach uses accumulation of negative charges in the dielectric-semiconductor structure. The electrical charges however are not produced directly at the layer/silicon interface but at the interface of $SiO_2/AlF_3$ in a $Si/SiO_2/AlF_3$ structure. A disadvantage of this passivation method is the use of fluorine. For environmental reasons the use of fluorine is preferably avoided.

Furthermore, it is known that, as a major difference to most other dielectrics like silicon nitride or silicon dioxide where fixed positive charges are stored at the interface, properly treated atomic layers of $Al_2O_3$, for example, formed by chemical vapor deposition (CVD), form negative fixed charges at the silicon surface with a density in the order of $10^{12}$-$10^{13}$ $cm^{-2}$. Earlier CV analysis of this kind of passivation layer showed a flat-band shift of 0.6-0.7 V to positive voltages, which corresponds to a negative fixed charge with density of $N_f > 1*10^{12}$ $cm^{-2}$.

When dielectrics of the above described type are deposited on p-type silicon, they induce an accumulation layer and a reduction of the effective surface recombination velocity is anticipated. The band bending due to this negative charge provides a very effective field induced surface passivation, on high and, remarkably, on low resistivity wafers too, making it a superior choice with respect to diffused BSF. In addition, the material quality in the drift field region is preserved, as there is no in-diffusion of dopant species or impurities, nor formation of bulk defects typical of highly doped perturbed lattices. In contrast to dielectrics with a high positive charge, for example, standard SiNx:H, where field passivation is due to an inversion layer which needs to be floating and is very sensitive to parasitic shunting, no contact separation is needed.

SUMMARY OF THE INVENTION

A semiconductor solar cell and a method for surface passivation of a semiconductor, for example, silicon, solar cell, which accumulates charges of a first type are provided. The solar cells are relatively cheap, easy to manufacture, and which do not introduce environmental problems as severe as some known techniques.

The above objective is accomplished by a method and system according to the preferred embodiments.

In a first aspect, a method is provided for surface passivation of a semiconductor solar cell, for example, a silicon solar cell, comprising applying an oxide system at a surface of the solar cell. The oxide system comprises at least two oxides, i.e. $Al_2O_3$ and at least one metal oxide, such as, for example, $TiO_2$ or $ZrO_2$, or metalloid (semi-metal) oxide, such as, for example, $SiO_2$, which enhances the tetrahedral structure of $Al_2O_3$. The oxide system can be a binary oxide system comprising $Al_2O_3$ and a metal oxide or metalloid (semi-metal) oxide which enhances the tetrahedral structure of $Al_2O_3$. $Al_2O_3$ can have two forms, if which the tetrahedral from is less common but it is this form that has the right charge for surface passivation of semiconductor solar cells according to the preferred embodiments.

The method according to the preferred embodiments has several advantages over the prior art. The deposition process is potentially low-cost and does not require expensive equipment. Furthermore, the process is very reproducible, due to the fact that the developed process is not critical to the technological conditions. Moreover, it is not necessary to deposit an intermediate $SiO_2$-layer and the use of fluorine can be avoided with all the environmental and processing benefits thereof.

In a preferred embodiment, the oxide system can comprise a mixture of $Al_2O_3$ and the at least one metal oxide or metalloid oxide. In general the $Al_2O_3$ can be mixed with one or more metal oxides and/or with one or more metalloid oxides. In case of a binary oxide system being used, the $Al_2O_3$ is mixed with just one metal oxide or metalloid oxide.

Compound systems or mixtures used in a method according to the preferred embodiments, such as, for example $(Al_2O_3)_x(TiO_2)_{1-x}$, are combinations of two or more oxides. These alloy systems are predominantly non-stoichiometric mixtures and are therefore, in the case of a mixture of two materials, termed pseudobinary alloys (see paper of G. Wilk et al J. Appl. Physics v. 89, 10, p. 3262, 2001). In this way, it is possible to vary the ratio of the plurality of oxides and to obtain thin films with certain pre-set characteristics, such as refractive index, extinction coefficient, energy band gap, dielectric constants, etc. It is furthermore possible to combine the desirable properties from the different oxides, while possibly eliminating the undesirable properties of each individual material. In one preferred embodiment, non-stoichiometric mixtures of $Al_2O_3$ and the at least one metal oxide and/or metalloid oxide, can be used as a passivating layer for surface passivation of a semiconductor solar cell, for example, pseudobinary alloys (also called pseudobinaries), comprising an $Al_2O_3$ component and a metal oxide or metalloid oxide which enhances the tetrahedral structure of $Al_2O_3$. For example, the passivating layer can consist of a pseudobinary $(Al_2O_3)_x(TiO_2)_{1-x}$ alloy, comprising a mixture of $Al_2O_3$ and $TiO_2$. The mixture can have a fixed ratio of $Al_2O_3$ to the metal oxide or metalloid oxide, for example, a fixed ratio of $Al_2O_3$:$TiO_2$. The mixture of two or more oxides, either a stoichiometric or a non-stoichiometric mixture, can be prepared by a sol-gel method.

In a method according to a preferred embodiment, applying the oxide system, for example, binary oxide system, can comprise spin-coating the oxide system.

In a second aspect, a solar cell having backside surface passivation is provided. The solar cell comprises a semiconductor substrate having a major surface and an oxide system on the major surface, the oxide system comprising $Al_2O_3$ and at least one metal oxide and/or metalloid oxide which enhances the tetrahedral structure of $Al_2O_3$. The oxide system can be a binary oxide system comprising $Al_2O_3$ and a metal oxide or metalloid (semimetal) oxide which enhances the tetrahedral structure of $Al_2O_3$. Alternatively, the oxide system can comprise more than two oxides, for example, in the case of three oxides, $Al_2O_3$ and two metal oxides, or $Al_2O_3$ and two metalloid oxides, or $Al_2O_3$, one metal oxide and one metalloid oxide.

In a preferred embodiment, the oxide system can comprise a mixture of $Al_2O_3$ and the at least one metal oxide, for example, $TiO_2$ or $ZrO_2$, and/or metalloid oxide, for example, $SiO_2$.

In one embodiment, the mixture can be a stoichiometric mixture. In another embodiment, the mixture can be a non-stoichiometric mixture, which in case of a mixture of two oxides is called a pseudobinary alloy (also called a pseudobinary), which comprises an $Al_2O_3$ component and at least one metal oxide and/or metalloid oxide. In this way it is possible to combine the desirable properties from the different oxides, while eliminating the undesirable properties of each individual material.

The mixture can be a pseudobinary alloy at a fixed ratio of $Al_2O_3$ to the metal oxide or metalloid oxide, for example, a fixed ratio of $Al_2O_3$:$TiO_2$.

In another preferred embodiment, the solar cell can further comprise a backside metal contact. This backside metal contact can be a metal grid direct on the semiconductor, for example, p-type silicon, substrate or a metal reflector.

In a first embodiment, a method for surface passivation of a semiconductor solar cell, the method comprising applying an oxide system comprising $Al_2O_3$ and at least one metal oxide or metalloid oxide to a semiconductor surface of the semiconductor solar cell, wherein the metal oxide or the metalloid oxide increases an amount of $Al_2O_3$ having a tetrahedral structure in the oxide system, and whereby the semiconductor surface is passivated.

In an aspect of the first embodiment, the oxide system is a binary oxide system.

In an aspect of the first embodiment, the oxide system comprises a mixture of $Al_2O_3$ and the at least one metal oxide or metalloid oxide.

In an aspect of the first embodiment, the mixture comprises a pseudobinary alloy.

In an aspect of the first embodiment, the pseudobinary alloy has a fixed ratio of $Al_2O_3$ to the at least one metal oxide or metalloid oxide.

In an aspect of the first embodiment, the mixture is prepared by a sol-gel method.

In an aspect of the first embodiment, applying the oxide system comprises spin-coating the oxide system.

In an aspect of the first embodiment, the metal oxide comprises $TiO_2$ or $ZrO_2$.

The method according to claim 1, wherein the metalloid oxide comprises $SiO_2$.

In an aspect of the first embodiment, a molar ratio of aluminum to metal or metalloid in the oxide system is from about 1:1 to about 2:1.

In an aspect of the first embodiment, a molar ratio of aluminum to metal or metalloid in the oxide system is about 1.5:1.

In an aspect of the first embodiment, the semiconductor comprises silicon.

The method according to claim 1, wherein the semiconductor comprises a monocrystalline semiconducting material.

In an aspect of the first embodiment, the semiconductor comprises a polycrystalline semiconducting material.

In an aspect of the first embodiment, the semiconductor comprises an amorphous semiconducting material.

In a second embodiment, a solar cell comprising a backside surface passivation is provided, comprising semiconductor substrate comprising a major surface; and an oxide system on the major surface, the oxide system comprising $Al_2O_3$ and at least one metal oxide or metalloid oxide, wherein the at least one metal oxide or metalloid oxide increases an amount of $Al_2O_3$ having a tetrahedral structure in the oxide system.

In an aspect of the second embodiment, the oxide system comprises a binary oxide system.

In an aspect of the second embodiment, the oxide system comprises a mixture of $Al_2O_3$ and the at least one metal oxide or metalloid oxide.

In an aspect of the second embodiment, the mixture comprises a pseudobinary alloy.

In an aspect of the second embodiment, the pseudobinary alloy has a fixed ratio of $Al_2O_3$ to the at least one metal oxide or metalloid oxide.

In an aspect of the second embodiment, the metal oxide comprises $TiO_2$ or $ZrO_2$.

In an aspect of the second embodiment, the at least one metalloid oxide comprises $SiO_2$.

In an aspect of the second embodiment, the solar cell further comprises a backside metal contact.

In an aspect of the second embodiment, the backside metal contact comprises a metal grid directly on the semiconductor substrate.

In an aspect of the second embodiment, the backside metal contact comprises a metal reflector.

In an aspect of the second embodiment, a molar ratio of aluminum to metal or metalloid in the oxide system is from about 1:1 to about 2:1.

In an aspect of the second embodiment, a molar ratio of aluminum to metal or metalloid in the oxide system is about 1.5:1.

In an aspect of the second embodiment, the semiconductor comprises silicon.

In an aspect of the second embodiment, the semiconductor comprises a monocrystalline semiconducting material.

In an aspect of the second embodiment, the semiconductor comprises a polycrystalline semiconducting material.

In an aspect of the second embodiment, the semiconductor comprises an amorphous semiconducting material.

BRIEF DESCRIPTION OF THE DRAWINGS

FIG. 1*a* is an energy band diagram of a n+-p-p+ solar cell.

FIG. 1*b* is an energy band diagram of a n+ p solar cell with back surface passivation layer.

FIG. 2*a* is an energy band diagram of a MIS structure in case of a p-type semiconductor at $V_G=0$.

FIG. 2*b* is an energy band diagram of a MIS structure in case of a p-type semiconductor at flat band conditions.

DETAILED DESCRIPTION OF THE PREFERRED EMBODIMENT

Figure 3:
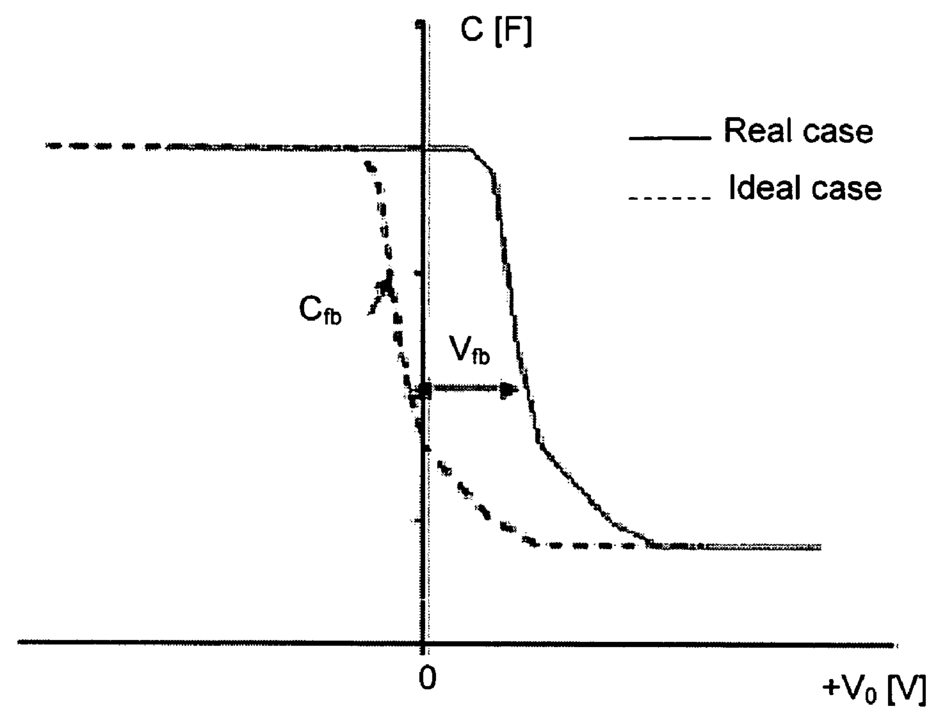
FIG. 3 is a high frequency CV curve for an ideal and a real MIS structure with p-type semiconductor.

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

The present invention is described with respect to particular embodiments and with reference to certain drawings but the invention is not limited thereto but only by the claims. The drawings described are only schematic and are non-limiting.

In the drawings, the size of some of the elements may be exaggerated and not drawn on scale for illustrative purposes.

The preferred embodiments are described with reference to solar cells but the preferred embodiments are not limited thereto. The preferred embodiments can be applied to any form of semiconductor product.

According to a preferred embodiment, solar cells and a method for passivating a surface of a semiconductor solar cell, for example, a silicon solar cell, are provided by using dielectrics which accumulate charge of a first type, for example, negative charge, at the dielectric/semiconductor interface are provided.

As a start, $Al_2O_3$ layers were used as a passivating layer. $Al_2O_3$ layers were deposited by atomic layer deposition (ALD) on both sides of 2 Ohm·cm, 8" CZ—Si wafers. This growth technique can provide atomic layer control and allows conformal films to be deposited on very high aspect ratio structures. ALD is based on sequential, self-limiting surface chemical reactions. For deposition of $Al_2O_3$, the binary reaction $$2Al(CH_3)_3+3H_2O \rightarrow Al_2O_3+6CH_4 \quad (1)$$

can be split in the following two surface half reactions:

$$AlOH^*+Al(CH_3)_3 \rightarrow AlOAl(CH_3)_2^*+CH_4 \quad (2)$$

and $$AlCH_3^*+H_2O \rightarrow AlOH^*+CH_4 \quad (3)$$

where the asterisks denote the surface species. In reaction (2) $Al(CH_3)_3$ reacts with the hydroxyl species (OH*) and produces a dimethylaluminum covered surface. In reaction (3), $H_2O$ reacts with the AlCH3* species and rehydroxilates the surface. An excess of precursors is applied during each half reaction, so they proceed until all sterically available surface species have reacted. Therefore, each reaction is self-limiting, and $Al_2O_3$ deposition occurs with atomic layer control. Half-reactions (2) and (3) are repeated until an $Al_2O_3$ layer of the desired thickness is achieved. The full process never reaches temperatures above 300° C., making it de facto a low-temperature process, harmless to the substrates and with a low thermal budget.

Figure 4:
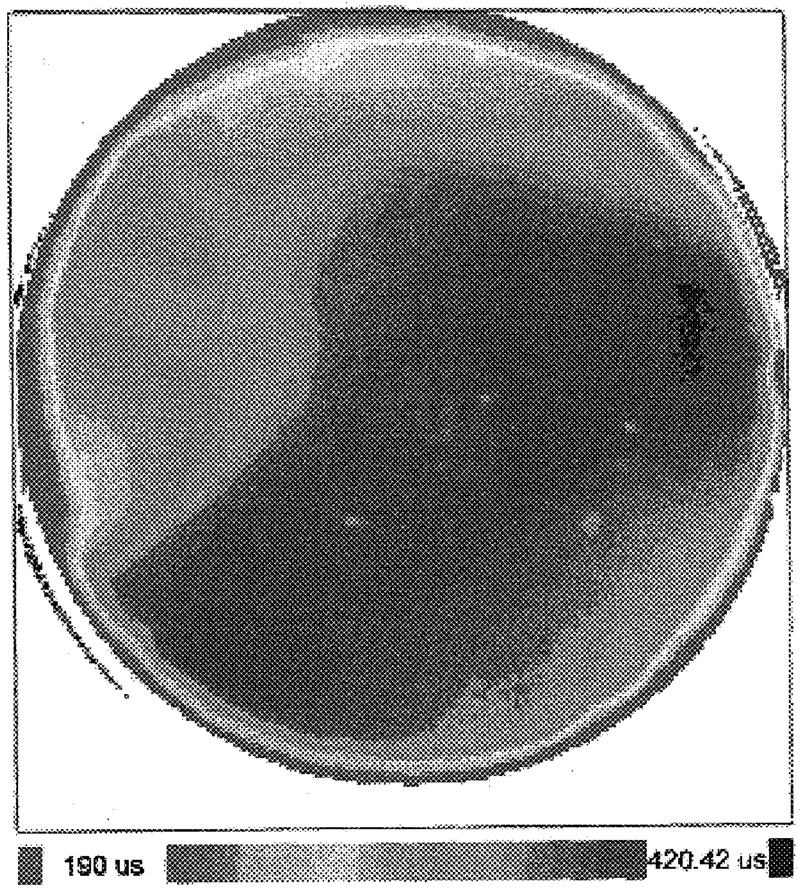
FIG. 4 shows a typical effective carrier lifetime map ($\Delta n=10^{13}$-$10^{14}$ $cm^{-3}$) of an 8" inch CZ silicon wafer passivated with a treated $Al_2O_3$ layer.

The deposited layers were then treated and characterized. Effective lifetime maps were measured with a μ-PCD system from Semilab, and carrier injection dependent lifetimes were measured in different regions of the samples by means of a Quasi Steady-State Photo Conductance (QSSPC) technique. Charge densities were determined with C-V measurements. A typical lifetime map obtained from these $Al_2O_3$ layers is given in FIG. 4.

Figure 5:
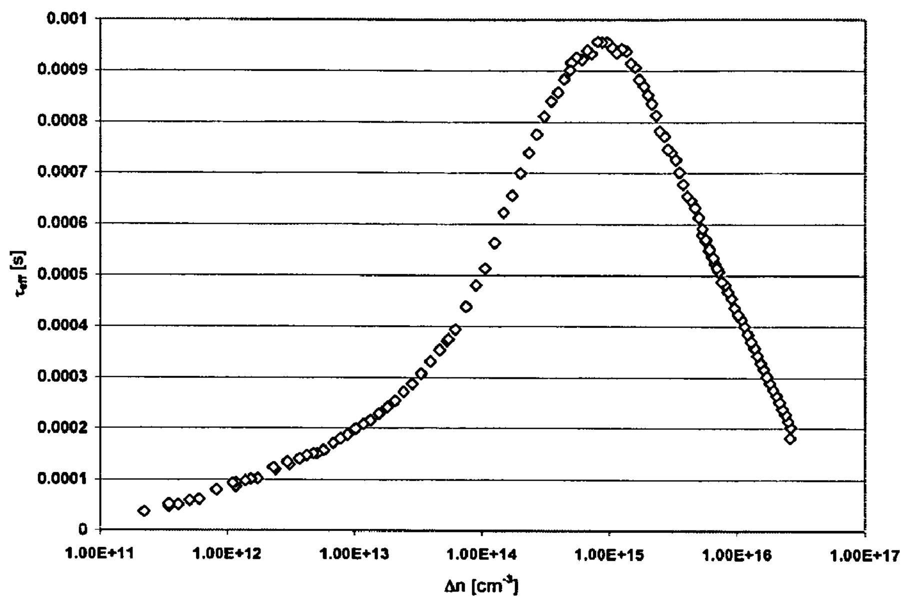
FIG. 5 shows the injection dependent lifetime of charge carriers in a solar cell passivated with an $Al_2O_3$ layer, measured with the QSSPC method.
Figure 6:
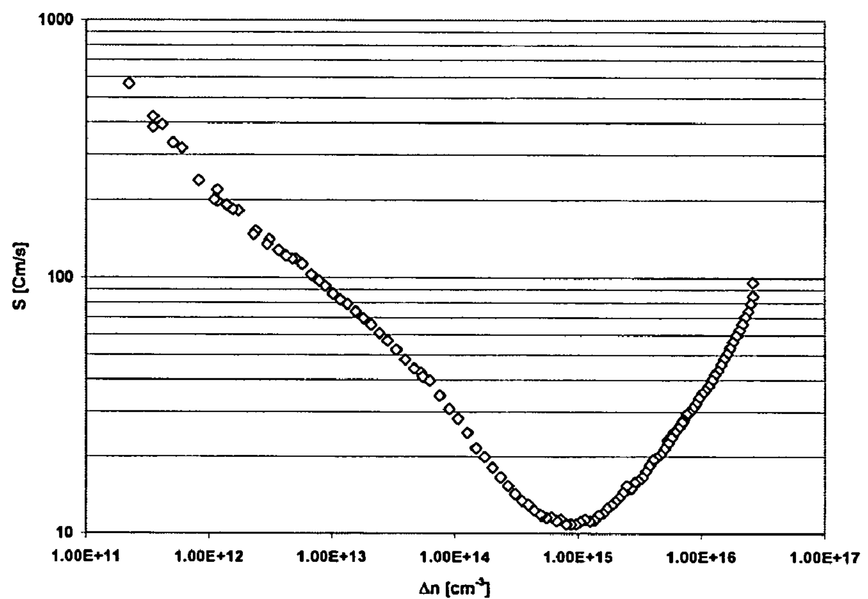
FIG. 6 shows surface recombination velocity of charge carriers in a solar cell passivated with an $Al_2O_3$ layer, calculated assuming a bulk lifetime of 2 ms in the 2 Ω·cm CZ silicon wafer.

FIGS. 5 and 6 respectively represent the injection dependent lifetime measured with QSSPC and the (conservative value for) surface recombination velocity calculated assuming a bulk lifetime of 2 ms. Throughout the whole range of operation of a solar cell, the surface recombination velocity is in the order of 100 cm/s, reaching a minimum of 10 cm/s at an injection level of $10^{15}$ $cm^{-3}$. No degradation of the surface passivation properties has been observed after prolonged high temperature treatments (up to 820° C. for 60 minutes).

A high density of charge resulted to be crucial for proper surface passivation. Measurements carried out on samples with a density of charge less than $10^{11}$ $cm^{-2}$ resulted in a more modest performance. The fixed negative charge at the interface for the considered sample, as calculated from C-V measurements, is about $-1.3\times10^{12}$ $cm^{-2}$. Values as high as $-1\times10^{13}$ $cm^{-2}$ can be obtained. This net negative charge is consistent with a model for the local atomic bonding of non-crystalline $Al_2O_3$ that has two different bonding environments for the Al atoms, as described by G. Lukovsky et al in Proc. of the Characterisation and Metrology for ULSI Technology, 154-158 (2000). The dielectric can be described as a modified continuous random network including a charged network and discrete ions. According to this model the structural formula of $Al_2O_3$ is given by $$2(Al_2O_3)=3(AlO_{4/2})^{-1}+Al^{3+}$$

The $Al^{3+}$ ons occupy octahedral interstitial sites of the network, and form three resonating, partially covalent donor-acceptor pair bonds with bridging oxygen atoms of that network.

Figure 7:
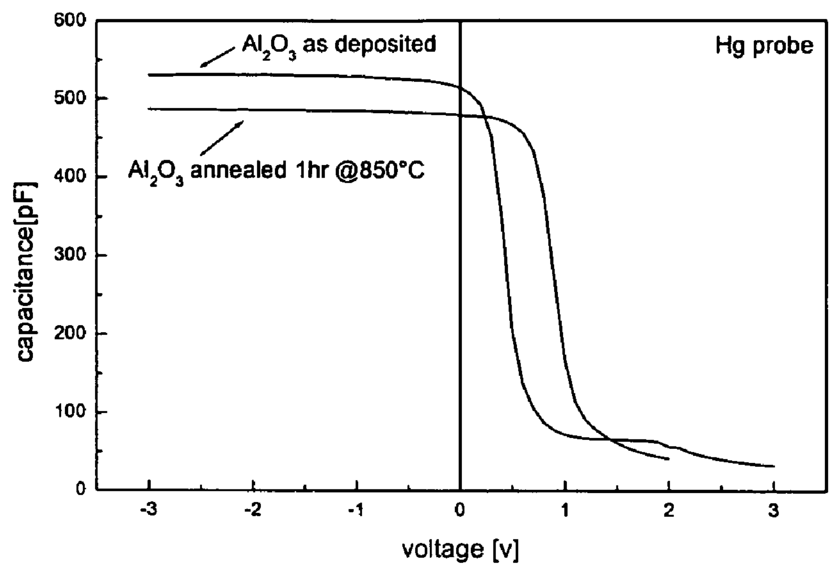
FIG. 7 shows C-V characteristics of the deposited $Al_2O_3$ layers before and after thermal annealing treatment. The increase of the flat-band shift in the annealed sample indicates an increased negative interface charge density.

The reason for the negative charge at the $Al_2O_3$/Si interface is that the Al ions rearrange in tetrahedrically coordinated Al sites with a net negative charge bonded directly to the O atoms of the $SiO_2$ interfacial. Thermal or 'firing' conditions typical for solar cell processing do not affect the passivation properties of optimized layers. The net amount of fixed negative charge remains substantially stable, if it is not even increased (see FIG. 7). The surface recombination velocity remains in the same order of magnitude. No significant degradation of the layers has been shown over a period of 6 months. The increase of the flat-band shift in the annealed sample, as illustrated in FIG. 7, indicates an increased negative interface charge density.

$Al_2O_3$ layers, formed as described above, thus seem to be suitable for surface passivation of the base of crystalline silicon solar cells. Atomic Layer Deposition, however, is less preferable for industrial, large scale production. The layers are rather difficult to structure and the throughput of the system is very low.

Hence, the preferred embodiments provide the use of a combination or mixture of two or more oxides for use as passivation layer, one of the oxides being $Al_2O_3$ and the other at least one oxide being a metal oxide or metalloid oxide which enhances the tetrahedral structure of $Al_2O_3$. These mixtures or alloy systems can be predominantly non-stoichiometric mixtures and are called, in the case of a mixture of two materials, pseudobinary alloys (PBAs). They allow combining the desirable properties of the different oxides in order to obtain a dielectric system consisting of a thin film with certain pre-set values—refractive index, extinction coefficient, energy band gap, dielectric constants, and negative or positive trapped charges. The use of a mixture of two or more different oxides in non-stoichiometric compositions offers the opportunity for effective engineering of physical dielectric properties.

The preferred embodiments will hereinafter be described by means of binary oxide systems, but it is to be understood that the preferred embodiments can also include systems comprising more than two oxides.

Studies on the $(Al_2O_3)_x(TiO_2)_{1-x}$ system have revealed that negative charge density in the order of $10^{12}$ $cm^{-2}$ can be stored by these layers at the interface with silicon. The results of surface passivation correlate with the net density of fixed charge derived from electrical measurements on MIS structures. Homogeneous, crack-free thin films (40-50 nm with a variation of ±2% in thickness) can be deposited on alkaline-etched mono and multicrystalline silicon wafers yielding surface recombination velocities comparable to those of evaporated Aluminum BSF.

According to a preferred embodiment, a binary oxide system, such as, for example, a pseudobinary alloy of the type $(Al_2O_3)_x(TiO_2)_{1-y}$, is used as a passivating layer. For a binary alloy, which is a preferred embodiment, y=x.

In accordance with a preferred embodiment, formation of the pseudobinary alloy can be carried out by a sol-gel method. Liquid phase deposition of thin dielectric films obtained by the sol-gel method has been actively used for several years in research laboratories for fabrication of optical devices and components. Recently, the technique has also demonstrated its potential for commercial manufacturing in various fields of application in semiconductor industry. Particular advantages are achieved with alloys of two metal oxides, i.e. with pseudobinary alloys.

Figure 8:
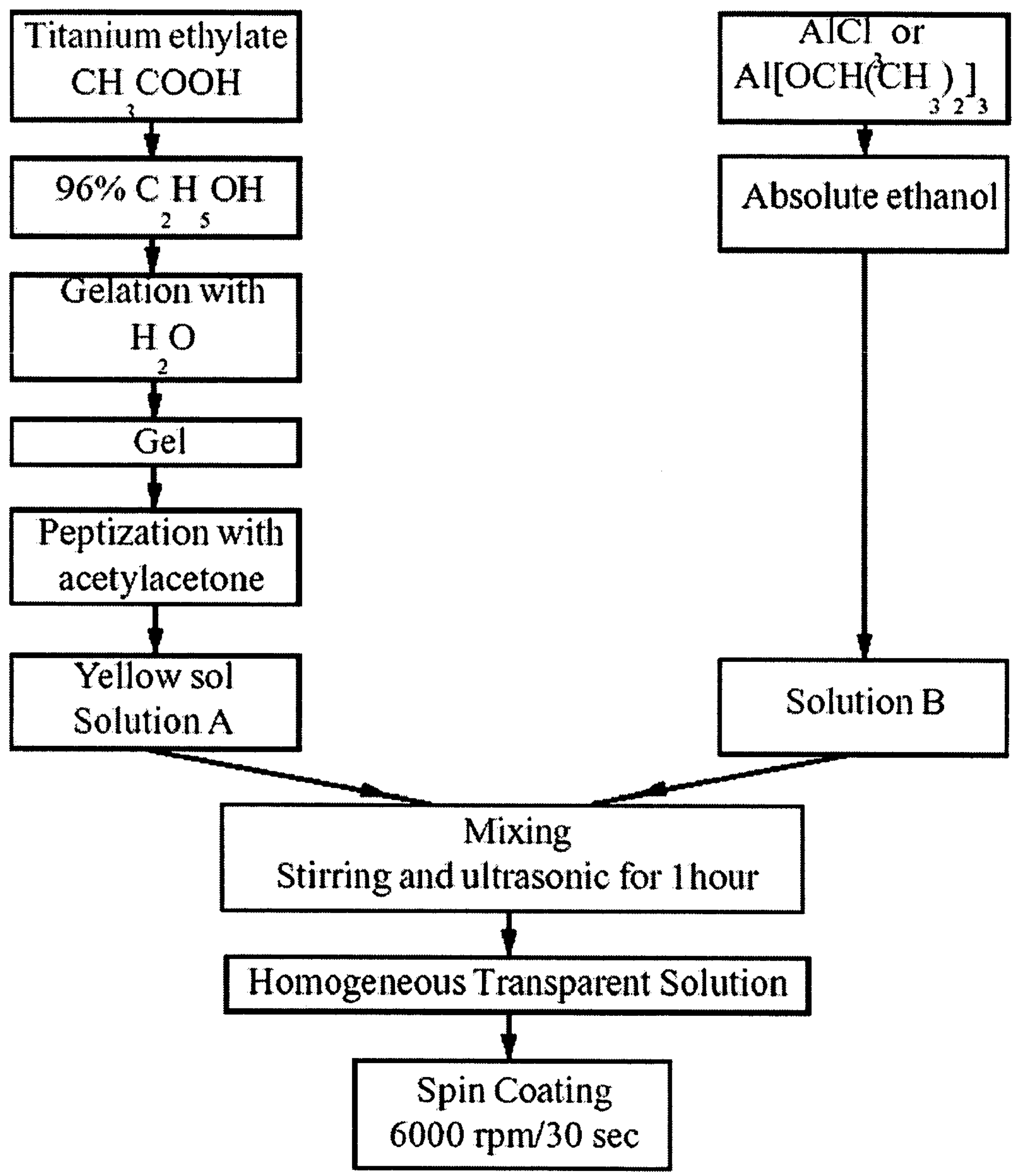
FIG. 8 is a flowchart for preparation of sol-gel $(Al_2O_3)_x(TiO_2)_{1-x}$ thin films in accordance with a preferred embodiment.

Different steps of such sol-gel method are illustrated by the flow chart shown in FIG. 8 and are explained hereinafter.

The first step in the preparation of a $(Al_2O_3)_x(TiO_2)_{1-x}$, alloy is the formation of a titanium dioxide sol. A titanium ethoxide can, for example, be used as a titanium precursor to form the $TiO_2$ films. Also other suitable precursors can be used here. By addition of acetic acid $C_2H_5OH$, preferably having a purity of at least 96%, to the titanium precursor an exothermic reaction is caused.

Acetate modification was performed in-situ by introducing of, for example, 1.5 mg, or any suitable amount, of glacial acetic acid. The process is exothermal and, keeping in mind the great difference in the stability constants of the two complexes, it leads to full substitution of alcoxic groups by the more stable acetic groups. Subsequent addition of a small amount of water, such as, for example, 60 mol, or any suitable amount, of water causes hydrolysis and a condensation reaction and results in gelation of the solution and the formation of a transparent gel. The addition of, for example, 1 mol, or any suitable amount, of acetylacetone leads to peptization of the gel. As it is seen from FIG. 8, after adding acetylacetone a stirring at low revolutions (100-150 rpm) follows.

A next step is the preparation of the aluminum sol. For the aluminum component, an organic aluminum source can be used such as aluminum chloride anhydrous $Al[OCH(CH)_3)_2]_3$. This is preferably dissolved in a suitable solvent such as, for example, absolute ethanol. The reaction is exothermal and can be explained as follows:

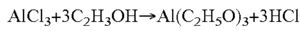

$$AlCl_3+3C_2H_3OH \rightarrow Al(C_2H_5O)_3+3HCl$$

The obtained solution preferably has a pH in the range of 1-1.2. The presence of HCl is appropriate for the preferred embodiments because the gettering effect of chlorine for undesirable metal impurities is well known. The latter are the main reason for decreasing the lifetime of minority carriers on Si surface. On the other hand, chlorine decreases the surface states density when thermal $SiO_x$ is grown on the Si surface.

In a last step both sols are mixed in suitable ratios and solutions with different aluminum contents can be produced. The ratios of the two oxide components can be altered by varying the quantity of the two precursors in the sol solutions. The Ti sol and Al solutions are carefully mixed together under mechanical agitation. Examples of mechanical agitation are stirring and ultrasonic treatment. The temperature is preferably maintained at 40° C. By increasing the content of Al in the solution, thus by increasing the concentration of the $Al[OCH(CH)_3)_2]_3$ compound, higher Al/Ti rations can be obtained in the $(Al_2O_3)_x(TiO_2)_{1-x}$ alloy, which has an advantage as explained below. The working solution is finally obtained after series of treatments in order to get homogeneous and filtered product, which is suitable for thin film deposition, for example, using spin-coating technique. The sols prepared according to this embodiment are stable for more than 5 months.

In another preferred embodiment, the precursor used for the aluminum component can be an inorganic one such as, for example, $AlCl_3$ anhydrous, also dissolved in a solvent, for example, absolute ethanol. Again, by increasing the concentration of $AlCl_3$ higher Al/Ti molar ratios can be obtained, with the advantage as explained below.

Once the $(Al_2O_3)_x(TiO_2)_{1-x}$ alloy is prepared, it can be deposited onto the silicon substrate by any suitable method. Spin coating is a preferred method.

In one preferred embodiment, the $(Al_2O_3)_x(TiO_2)_{1-x}$ alloy is deposited on a polished single crystal p-silicon wafer with orientation <100>. The layer deposition process can comprise the following steps.

A first step is a chemical cleaning process for the semiconductor substrate, for example, silicon substrate. Therefore the substrate can be dipped in a $H_2SO_4$:$H_2O_2$ (1:1) solution for 30 min. Because of the oxidizing nature of the chemicals, a native oxide layer is formed. Therefore, the next step in the cleaning process is oxide etching in HF 1:10 and subsequently rinsing in deionized water. As for this step fluorine is used in diluted quantities and because it is followed by a rinse step, no environmental pollution will occur. Finally the substrate is treated again in $H_2SO_4$:$H_2O_2$ (1:1) solution in order to form a very thin $SiO_2$ film with 1 nm thickness. The oxide film formed during this treatment is the result of a chemical cleaning which leaves a monolayer (or few monolayers) of oxide on the surface. This is called a native oxide and is useful for the growth/deposition of the pseudobinary alloy.

In a second step the thin $(Al_2O_3)_x(TiO_2)_{1-x}$ film is deposited onto the silicon substrate, for example, by spin coating with preferably 6000 to 8000 rpm for 30 sec. The layer's thickness depends on the ratio Al:Ti in the sol solution and is in the range of 40-70 nm. The samples are then dried, for example, at 80±5° C. for 30 min, in order to obtain a xerogel film and to remove residual solvents. Organic components are then pyrolized, for example, by firing at 350±10° C. in $O_2$ for 1 hour. A last step in the layer deposition process is high temperature annealing, for example, at 500-800° C. in $N_2$ or $O_2$. By this process the structure and the stoichiometry of the layers are formed. The $(Al_2O_3)_x(TiO_2)_1$-x alloy layer, deposited according to this embodiment, is dense, homogenous and smooth with good thickness uniformity of ±1% along the wafer. Preferably no pores, inhomogeneity, or pinholes exist in the layer.

By varying the $Al_2O_3$:$TiO_2$ ratio, basic optical and dielectric properties are changed. This approach can be used for effective engineering of the film dielectric properties.

Table 1 shows the results on fixed oxide charge of films deposited from 3 different sol solutions according to the above described embodiment. The different solutions contain increasing Al contents as follows:

Al1 with molar ratios Al:Ti=1:1,

Al1.5 with molar ratios Al:Ti=1.5:1, and

Al2 with molar ratios Al:Ti=2:1.

The tin films are deposited on p-type Si substrates and 2" sapphire.

Figure 9:
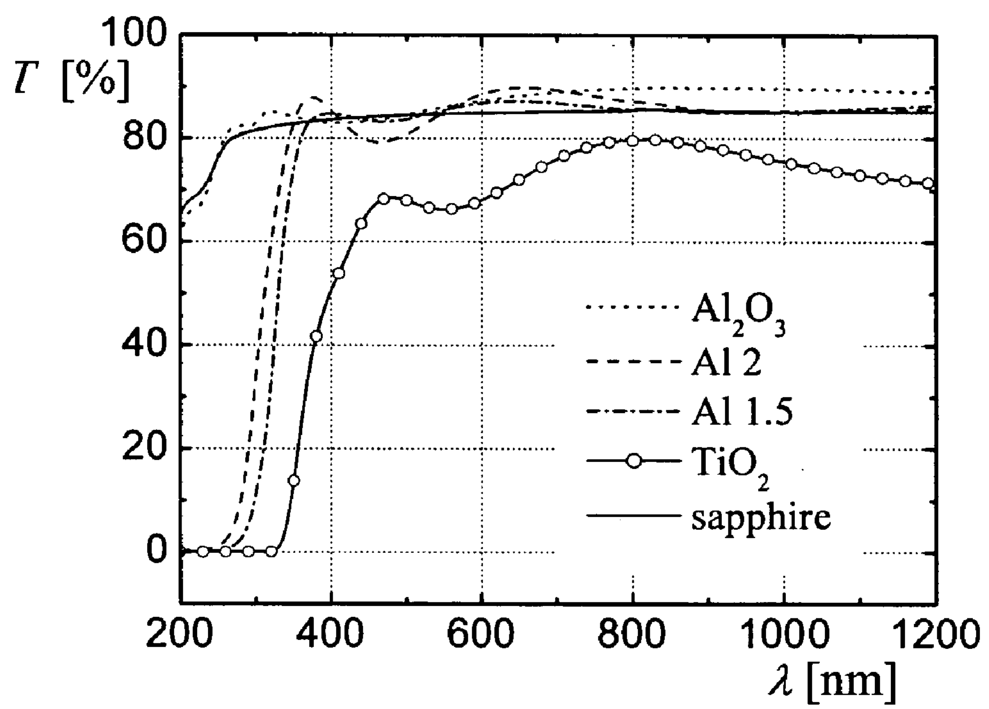
FIG. 9 illustrates transmission spectra of $(Al_2O_3)_x(TiO_2)_{1-x}$ films from solutions Al1.5 and Al2, and, for comparison reasons, of $TiO_2$ and $Al_2O_3$ films.

The transmission spectra of $Al_2O_3$, $TiO_2$ and $(Al_2O_3)_x(TiO_2)_{1-x}$ from sol solution Al:Ti=1.5 and 2 (Al1.5 and Al2, respectively) deposited onto sapphire are given in FIG. 9. Transmission of the bare substrate is shown with solid line. It is clearly seen that the layers are transparent in the visible region and their transmittance decreases in the UV region. The shift in the fundamental absorption edge towards shorter wavelengths is clearly observed when x increases.

Refractive index, n, and thicknesses, d, of the films were calculated simultaneously by minimization of the objective function F including sum of measured and calculated transmissions:

$$F = \sum_{i=1}^{N} [T_i^{meas} - T_i^{calc}]^2, \quad (1)$$

where N is the number of points in the transparent range of each layer over which the summation is performed. When calculating T small absorption in the substrate due to surface imperfections, as well as reflections from back side of the substrate are taken into account.

In order to perform the calculation, the dispersion of refractive index n was described with the Wemple-DiDomenico single-oscillator model.

$$n^2 = 1 + \frac{E_d E_0}{E_0^2 - E^2} \quad (2)$$

where $E_d$ and $E_0$ are the dispersion and single-oscillator energies, respectively and E—the photon energy. The initial estimates for $E_d$ and $E_0$, taken from the literature as well as the thickness are varied until a good fit between the measured and calculated values of T is found.

Figure 10:
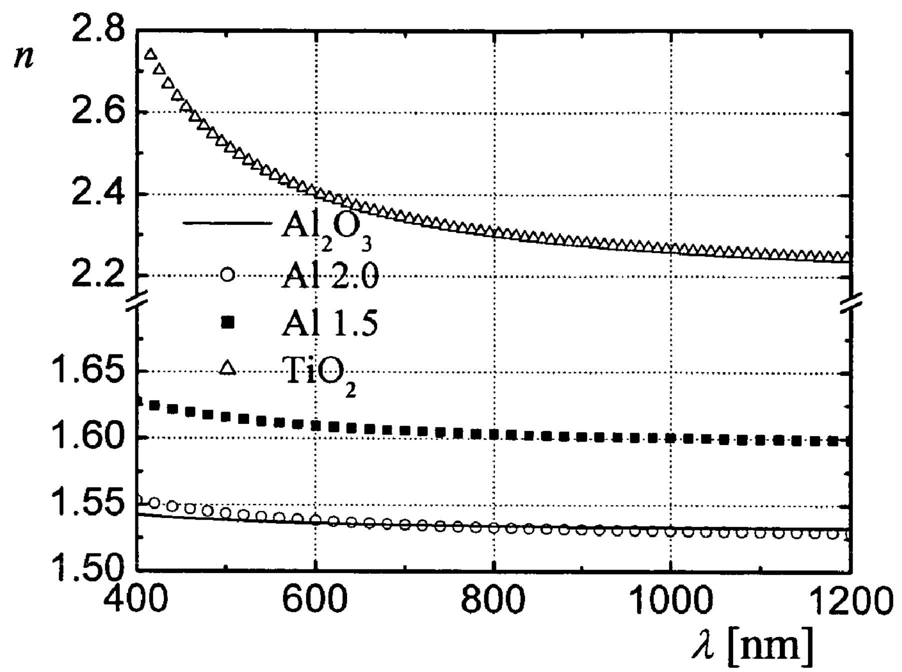
FIG. 10 illustrates refractive index dispersion for $(Al_2O_3)_x(TiO_2)_{1-x}$ films from solutions Al1.5 and Al2, and, for comparison reasons, of $TiO_2$ and $Al_2O_3$ films.

FIG. 10 presents the spectral dependencies of the refractive indices for some layers. As can be seen (except for $TiO_2$) n obeys weak dispersion and decreases slowly when $\lambda$ increases. The influence of x is much pronounced: the refractive index grows with the decrease of x. In the spectral range 600-1200 nm the difference between n for pure $Al_2O_3$ and thin film with Al:Ti=2:1 is negligible. Around the absorption edge the difference between them increases.

In order to compare the results derived from spectral data independent ellipsometric measurements of films, deposited on silicon substrates have been done. A He—Ne laser ellipsometer at 632.8 nm-LEF-3M, produced by the Russian Academy of Sciences, Novosibirsk has been used.

All the wafers were measured at 5 points along the wafer and a very good thickness uniformity is found (±5%). For precise determination of the refractive index and the extinction coefficient the method of variable angle of incidence was applied. The results for pure $Al_2O_3$ and $(Al_2O_3)_x(TiO_2)_{1-x}$ from solutions Al 2 and Al 1.5 are as follows (Table 1):

TABLE 1

| Sol solution | n | k | d[nm] |
|---|---|---|---|
| $Al_2O_3$ | 1.525 | 0.000 | 133.2 |
| Al 2 | 1.583 | 0.009 | 193.8 |
| Al 1.5 | 1.69 | 0.005 | 234.2 |

The good agreement between the results derived by transmission and reflection measurements on one hand and ellipsometry on the other, indicate that the layers are homogenous along their thickness with fairly reproducible properties.

The absorption coefficient $\alpha$ ($\alpha$=4$\pi$k/$\lambda$) was calculated from measured T and R using the thickness already obtained, from the approximated equation:

$$\alpha = \frac{1}{d}\ln\frac{1-R}{T}$$

Figure 11:
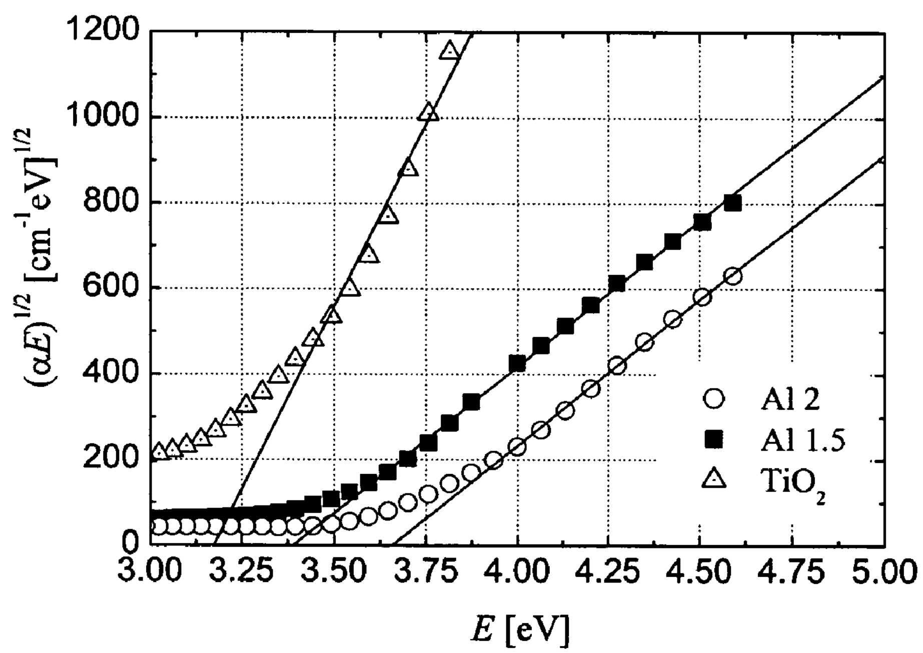
FIG. 11 illustrates Tauc plots for $(Al_2O_3)_x(TiO_2)_{1-x}$ films from solutions Al1.5 and Al2, and, for comparison reasons, of $TiO_2$ and $Al_2O_3$ films, for determining optical gap.

For determination of the optical band gap $E_g$ the values of a were fitted to Tauc's formula. The variation of $(\alpha E)^{1/2}$ with photon energy E is given in FIG. 11. The optical band gap for allowed indirect transitions was deduced from the intersection of the extrapolated linear part with the energy axis. Increasing the $Al_2O_3$ content in $(Al_2O_3)_x(TiO_2)_{1-x}$ the optical band gap $E_g$ increases from 3.17 eV for pure $TiO_2$ to $E_g$>6 eV for pure $Al_2O_3$ (Table 2).

TABLE 2

| Type of solution | Eg [eV] |
|---|---|
| Pure $TiO_2$ | 3.17 |
| Al 1.5 | 3.3 |
| Al 2 | 3.65 |
| Pure $Al_2O_3$ | >6 |

The charge of the first type being a negative fixed oxide charge is characteristic for all the annealed films described above. With increasing Al content of the solution the negative charge $N_f$ increases.

TABLE 3

| | $N_f$[cm$^{-2}$] |
|---|---|
| Sol solution Type Al 1 | $-4.9 * 10^{11}$ |
| Sol solution Type Al 1.5 | $-5.2 * 10^{11}$ |
| Sol solution Type Al 2 | $-6.6 * 10^{11}$ |

In another preferred embodiment, the $(Al_2O_3)_x(TiO_2)_{1-x}$ alloy is deposited onto an unpolished single crystal p-silicon wafer. The $(Al_2O_3)_x(TiO_2)_{1-x}$ film is uniformly deposited onto the surface and follows the relief of the substrate. The films, which were deposited on these unpolished single crystal p-silicon wafers, were with effective thickness two times thinner than on polished Si-substrates.

The above results were obtained by C-V measurements on MIS structures. The resulting difference is due to the different surface morphology of the surface. Flatter (polished) surfaces give thinner layers.

In yet another preferred embodiment, the $(Al_2O_3)_x(TiO_2)_{1-x}$ alloy is deposited onto a polycrystalline silicon wafer. The deposited film represents a uniform coating without inhomogeneities along the depth. The $(Al_2O_3)_x(TiO_2)_{1-x}$ layer shows no substantial difference in the film thickness, the film coats the substrate uniformly. The thickness of the layer is smaller as compared to that of the polished substrates.

Electrical measurements were performed on MIS structures. The used Si substrates were p-type <100>, unpolished p-Si and multicrystalline Si. In order to avoid the reaction between the metal electrode and the dielectric layer, Hg probe is used. This case is closer to the situation, when the dielectric layer is utilized for surface passivation.

All the capacitance-voltage (C-V) measurements of MIS structures with areas $2\times10^{-3}$ cm$^2$ and $4.8\times10^{-3}$ cm$^2$ revealed that the thin films possess very good dielectric isolation and absence of pinholes. The characteristic feature for boundary surface dielectric-Si is the formation of "negative fixed charge" with density $D_f$=4-6$\times10^{11}$ cm$^{-2}$.

The overall dielectric permittivity of the pseudobinary alloy $(Al_2O_3)_x(TiO_2)_{1-x}$ is always lower than that of pure $TiO_2$ but it results from $Al_2O_3$ component presence. The dielectric constant decreases with the increase of the component with low dielectric constant-aluminum oxide (Table 4). This is another demonstration of the fact that combining different oxides a multi-component oxide layer with varying physical properties is obtained.

TABLE 4

| Type of solution | Dielectric constant |
|---|---|
| Al 1 | 8 |
| Al 1.5 | 7.25 |
| Al 2 | 6.5 |
| Pure $Al_2O_3$ | 5 |

The influence of $(Al_2O_3)_x(TiO_2)_{1-x}$, film thickness on the properties of the dielectric/semiconductor structure. The sol solution Al1.5 was chosen as it was found that it secured the most suitable films for backside passivation. In order to assess the influence of high temperature annealing, experiments with two temperatures: 650 and 750° C. were carried out. The films were obtained with different thickness by spin-deposition of 1, 2 and 3 layers. The results are presented in Table 5.

TABLE 5

| No wafer | Layers | $T_{annealing}$, 1 h, N2 | | n | d [A] |
|---|---|---|---|---|---|
| 1x | 1 | 750° C. | Center | 1.604 | 464 |
| | | | down | 1.623 | 395 |
| 2x | 1 | 650° C. | Center | 1.585 | 495 |
| | | | down | 1.612 | 441 |
| 3x | 2 | 750° C. | Center | 1.611 | 871 |
| | | | down | 1.615 | 790 |
| 4x | 2 | 650° C. | Center | 1.631 | 1059 |
| | | | down | 1.634 | 993 |
| 5x | 3 | 750° C. | Center | 1.629 | 1455 |
| | | | down | 1.626 | 1400 |
| 6x | 3 | 650° C. | Center | 1.66 | 1630 |
| | | | down | 1.667 | 1476 |

The refractive indices do not depend on the film thickness and the temperature treatments. The films annealed at 750° C. possibly become denser and for that reason their thickness is 12% lower than that of the films annealed at 650° C.

The results of capacitance-voltage measurements at 1 MHz with Hg probe are presented in Table 6.

TABLE 6

| Sample | $C_{max}$ [pF] | $D_f$[cm$^{-2}$] |
|---|---|---|
| 1x | 508 | −6.39E+11 |
| 2x | 553 | −6.09E+11 |
| 3x | 453.2 | −5.76E+11 |
| 4x | 503 | −6.15E+11 |
| 5x | 335 | −4.28E+11 |
| 6x | 398 | −4.89E+11 |

Figure 12:
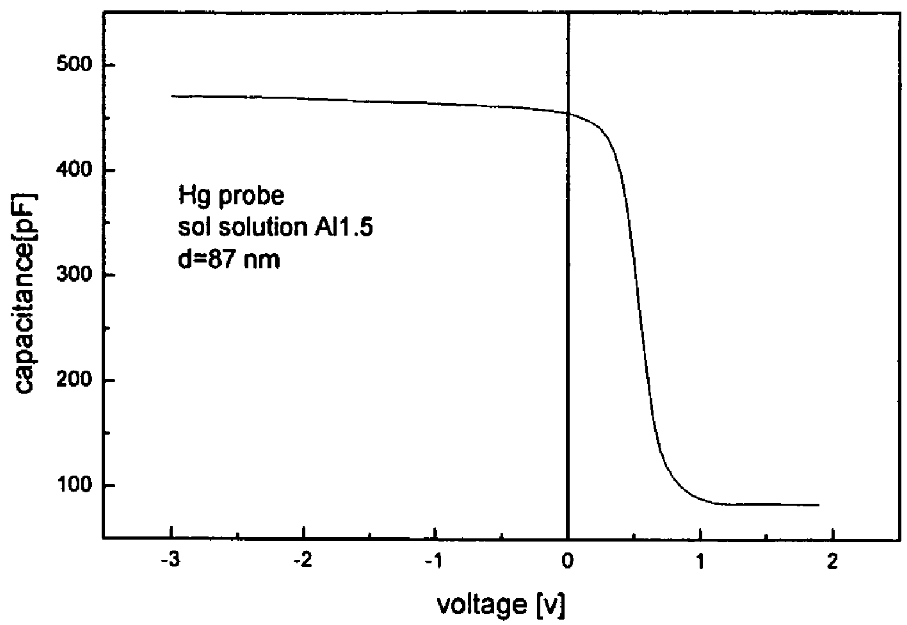
FIG. 12 illustrates the capacitance-voltage characteristic of an $(Al_2O_3)_x(TiO_2)_{1-x}$ film from sol solutions Al1.5.

The given values are the average from 5 points measurements. The fixed charge is determined as "negative" with density Df=5-6×1011 cm-2. At zero bias voltage, the silicon substrate is in accumulation (FIG. 12).

It is to be noted that the dielectric constant increases with film thickness. This effect is characteristic for all metal oxides and it is subjected for discussion in literature.

Figure 13:
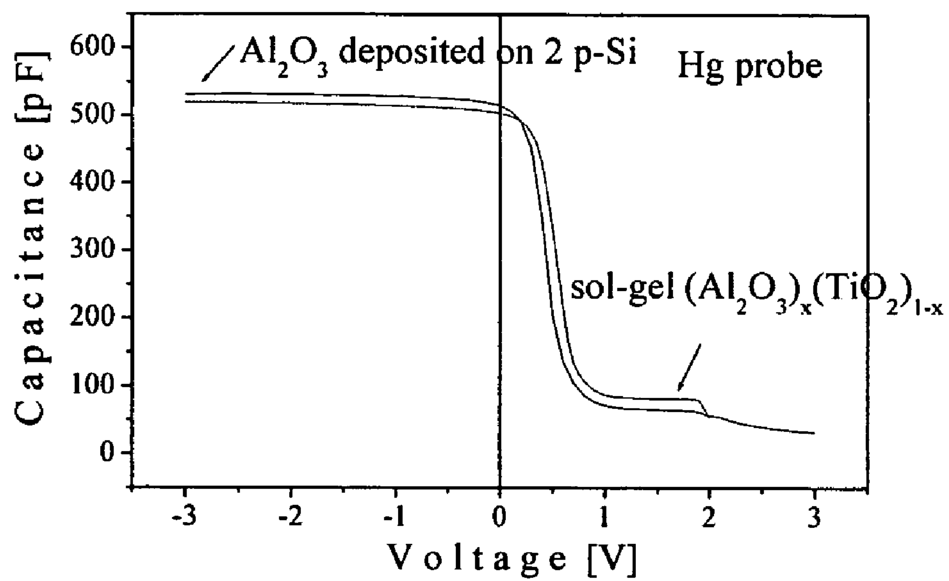
FIG. 13 illustrates capacitance-voltage characteristics for comparison of pseudobinary alloy $(Al_2O_3)_x(TiO_2)_{1-x}$ with the structures of Atomic Layer CVD obtained $Al_2O_3$ films.

C-V characteristics, shown in FIG. 13, of pseudobinary alloy (Al2O3)x(TiO2)1-x and the structures of Atomic Layer CVD obtained Al2O3 films have been compared.

The thickness of CVD Al2O3 film is 10 nm, correspondingly the thickness of pseudobinary alloy is 46 nm. The upper electrode is a Hg probe. It is to be noted that no differences in capacitance of accumulation region are observed, although the great difference in thickness. For ALD CVD 10 nm thick film, this effect is connected with the small value of the effective dielectric constant.

The slope and the shape of the C-V curves are almost the same (FIG. 13), indicating that the densities of the interface states are the same, which in most cases determine the velocity of surface recombination.

According to a further preferred embodiment, sol solutions are developed which allow to deposit, for example, by spin-coating, a pseudobinary alloy $(ZrO_2)_x(Al_2O_3)_{1-x}$. Such thin film can be obtained on Si wafers with different thicknesses as a result of multiple spin coating procedures. After low temperature (350° C.) and high temperature (750° C.) annealing, homogeneous thin films are obtained with no visual defects.

TABLE 7

| Material | n | d [Å] |
|---|---|---|
| $(ZrO_2)_x(Al_2O_3)_{1-x}$ | 1.650 | 503 |
| $(ZrO_2)_x(Al_2O_3)_{1-x}$ | 1.632 | 550 |
| $(ZrO_2)_x(Al_2O_3)_{1-x}$ | 1.682 | 1464 |

The back side of the wafers is preferably covered with an Al layer to get ohmic contact with the substrate, for example, Si. The capacitance-voltage characteristics of the dielectric/Si structures as mentioned above have been measured by Hg probe with area $4.8\times10^{-3}$ cm$^2$.

Table 8 gives the results from the measurements of the fixed oxide charge and the dielectric constant. The highest "negative" charge values are obtained for films, containing $Al_2O_3$. The $D_f$ value for $(ZrO_2)_x(Al_2O_3)_{1-x}$ film is $4.5\times10^{11}$ cm$^{-2}$, the value for $Al_2O_3$ is $D_f$=$4.8\times10^{11}$ cm$^2$.

TABLE 8

| Material | d [Å] | $\epsilon$ | $D_f$[cm$^{-2}$] |
|---|---|---|---|
| $(ZrO_2)_x(Al_2O_3)_{1-x}$ | 503 | 5.12 | −4.05E+11 |
| $(ZrO_2)_x(Al_2O_3)_{1-x}$ | 550 | 6.70 | −4.56E+11 |
| $(ZrO_2)_x(Al_2O_3)_{1-x}$ | 1464 | 18.27 | −5.21E+11 |

A high dielectric constant (∈) is obtained for $(ZrO_2)_x(Al_2O_3)_{1-x}$ film, which makes it promising material for high-k dielectric.

The amorphous films, formed by the method of the preferred embodiments, show the following properties: optical transparency in the range of 350-1200 nm; negative fixed charge on the dielectric/Si interface with a density $D_f$=5-10×$10^{11}$ cm$^2$. In this case the accumulation region is formed on the p-type Si surface; good passivation properties due to low density of the surface states on the interface with Si. The effective surface recombination velocity is low (s~500 cm/s-1); and the deposited films are dense and can, for example, be applied as mask for phosphorous diffusion.

The method according to the preferred embodiments shows several advantages with respect to the prior art. The deposition process is low-cost, uses an easy technology and does not require expensive equipment. Furthermore, a high reproducibility of the results can be achieved, due to the fact that the developed process is not critical to the technological conditions. Moreover, the process according to the preferred embodiments does not need gases or hazard chemicals and hence, is respectively safe and ecological.

From the above, it can be understood that aluminum oxide is an ideal candidate for quality surface passivation of p-type silicon and solar cells application. The net negative fixed charge at its interface with silicon induces an accumulation layer which inherently provides a degree of field induced surface passivation.

Experiments

The following experiments have been done.

Experiment 1

1 or 2 layers of $(Al_2O_3)_x(TiO_2)_{1-x}$ were deposited on the backside of 16 wafer in 4 samples groups. The procedure scheme includes different temperature annealing. The samples were treated further by technological processes in IMEC for solar cells fabrication.

Experiment 2

$Al_2O_3)_x(TiO_2)_{1-x}$ films were deposited on both sides of 8 wafers (CZ—Si p-typed). The experiments were made according to the following scheme: 4 wafers were annealed at low temperature (only 350° C.); 4 wafers were annealed at low and high temperature; in IMEC, the samples were treated additionally and were measured with QSSPC method for evaluation of the surface recombination velocity of the dielectric/silicon interface.

Experiment 3

Experiments with 6 samples were realized according to the scheme:

TABLE 9

| Wafer No | Number of layers | Thickness d [Å] | Refractive Index n | Lifetime [μs] |
|---|---|---|---|---|
| 2 | One | 592 | 1.58 | 12.7 |
| 3 | One | 590 | 1.58 | 10.4 |
| 14/10 | Two | 1111 | 1.6 | 20.5 |
| 9 | Two | 1152 | 1.6 | 35 |
| 4 | Three | 1451 | 1.69 | 25.9 |
| 15/10 | Three | 1503 | 1.656 | 21.7 |

All the samples are annealed at 750° C. for 1 hour. The purpose was to estimate the effect of film thickness on the results from QSSPC measurements. The best results for effective lifetime are for films with thickness d=110-120 nm (see the table). In principle, the effective lifetime in Si should not depend on dielectric layer thickness. All the films with different thickness were annealed at one and the same high temperature (750° C./1 h) so a different density of the recombination centers in semiconductor cannot be expected. On the other hand, the surface recombination velocity should not depend on the thickness of the passivation layer.

Experiment 4

Experiments for evaluation of the feasibility of $(Al_2O_3)_x(TiO_2)_{1-x}$ films as phosphorous diffusion barriers were carried out. The films were deposited on one side of the Si wafers as follows:

TABLE 10

| Wafer No | Number of layers | Annealing temperature |
|---|---|---|
| 1 | Two | 350° C. |
| 2 | Two | 350° C. |
| 3 | Two | 350° C. |
| 4 | One | 750° C. |
| 5 | One | 750° C. |
| 6 | One | 750° C. |
| 7 | One | 350° C. |
| 8 | One | 350° C. |
| $9_x$ | One | 350° C. |
| 10 | Two | 750° C. |
| 11 | Two | 750° C. |
| 12 | Two | 750° C. |

The following technological processes have been carried out: phosphorous diffusion, $SiN_x$ deposition, front side contact and back side contact. This revealed that $(Al_2O_3)_x(TiO_2)_{1-x}$ films (with thickness optimization) can be used as phosphorous diffusion barrier. Also, this film can be left for back side passivation.

It is appreciated by persons skilled in the art that other methods than the ones described can be applied for depositing the passivation layer onto the silicon substrate. Furthermore, other materials than the ones described can be used, as long as they enhance the tetrahedral structure of $Al_2O_3$.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that can vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for surface passivation of a semiconductor solar cell, the method comprising:

applying a pseudobinary alloy oxide system comprising $Al_2O_3$ and at least one metal oxide to a semiconductor surface of the semiconductor solar cell, wherein the metal oxide comprises $TiO_2$ or $ZrO_2$, wherein the $Al_2O_3$ has a tetrahedral structure, and wherein a net negative fixed charge is formed at an interface between the semiconductor surface and the oxide system so as to induce an accumulation layer in p-type silicon which provides electrical field induced surface passivation to the semiconductor surface.

2. The method according to claim 1, wherein applying the pseudobinary alloy oxide system comprises spin-coating the oxide system.

3. The method according to claim 1, wherein a molar ratio of aluminum to metal in the pseudobinary alloy oxide system is from about 1:1 to about 2:1.

4. The method according to claim 1, wherein a molar ratio of aluminum to metal in the pseudobinary alloy oxide system is about 1.5:1.

5. The method according to claim 1, wherein the semiconductor comprises silicon.

6. The method according to claim 1, wherein the semiconductor comprises a monocrystalline semiconducting material.

7. The method according to claim 1, wherein the semiconductor comprises a polycrystalline semiconducting material.

8. The method according to claim 1, wherein the semiconductor comprises an amorphous semiconducting material.

9. The method according to claim 1, wherein the pseudobinary alloy oxide system forms a layer having a thickness of from 110 to 120 nm.

10. The method according to claim 1, wherein a surface recombination velocity of the solar cell is from 10 cm/s to 100 cm/s at an injection level of $10^{15}$ $cm^{-3}$.

11. The method according to claim 1, wherein a density of net negative fixed charge at the interface is from $-1\times10^{11}$ $cm^{-2}$ to $-1\times10^{13}$ $cm^{-2}$.

12. The method according to claim 1, wherein the pseudobinary alloy oxide system forms a modified continuous random network comprising a charged network and discrete $Al^{3+}$ ions, wherein the $Al^{3+}$ ions occupy octahedral interstitial sites of the network and form three resonating partially covalent donor-acceptor pair bonds with bridging oxygen atoms of the network.

13. The method according to claim 1, wherein the pseudobinary alloy oxide system forms a homogeneous, crack-free thin film of a thickness of from 40 nm to 50 nm with a variation of ±2% in thickness.

14. The method according to claim 1, wherein the pseudobinary alloy oxide system forms a xerogel film of a thickness of from 40 nm to 70 nm.

15. The method according to claim 1, wherein the pseudobinary alloy oxide system forms a dense, homogenous and smooth $(Al_2O_3)_x(TiO_2)_{1-x}$ alloy layer with a thickness uniformity of ±1%.

16. The method according to claim 1, wherein the pseudobinary alloy oxide system is a $(ZrO_2)_x(Al_2O_3)_{1-x}$ pseudobinary alloy.

17. The method according to claim 1, wherein the pseudobinary alloy oxide system is a $(Al_2O_3)_x(TiO_2)_{1-x}$ pseudobinary alloy.

18. The method according to claim 1, wherein the pseudobinary alloy oxide system forms a layer having no pores, no inhomogeneities, and no pinholes.

19. The method according to claim 1, wherein the pseudobinary alloy oxide system is fired at 350° C.±10° C. in $O_2$, whereby organic components are pyrolized.

20. The method according to claim 19, wherein the fired oxide system is annealed at 500-800° C. in $N_2$ or $O_2$.

21. The method according to claim 20, wherein firing is conducted for 1 hour.

22. The method according to claim 20, wherein applying the pseudobinary alloy oxide system comprises spin-coating the pseudobinary alloy oxide system.

23. The method according to claim 20, wherein the metal oxide comprises $ZrO_2$.

24. The method according to claim 20, wherein the metal oxide comprises $TiO_2$.

25. The method according to claim 24, wherein the fired pseudobinary alloy oxide system forms an $(Al_2O_3)_x(TiO_2)_{1-x}$ alloy layer.

26. The method according to claim 20, wherein the fired pseudobinary alloy oxide system is dense, homogenous and smooth with a thickness uniformity of ±1%.

27. A method for surface passivation of a semiconductor solar cell, the method comprising:

providing a pseudobinary alloy oxide system comprising $Al_2O_3$ and at least one metal oxide on a semiconductor surface of a semiconductor solar cell, wherein the metal oxide comprises $TiO_2$ or $ZrO_2$, wherein the $Al_2O_3$ has a tetrahedral structure, and wherein a net negative fixed charge is formed at an interface between the semiconductor surface and the oxide system so as to induce an accumulation layer in p-type silicon which provides electrical field induced surface passivation to the semiconductor surface.

28. The method according to claim 27, wherein the pseudobinary alloy has a fixed ratio of $Al_2O_3$ to the at least one metal oxide.

29. A method for surface passivation of a semiconductor solar cell, the method comprising:

preparing a mixture comprising $Al_2O_3$ and at least one metal oxide by a sol-gel method; and applying the mixture to a semiconductor surface of a semiconductor solar cell, whereby a pseudobinary alloy oxide system is obtained, wherein the metal oxide comprises $TiO_2$ or $ZrO_2$, wherein $Al_2O_3$ of the pseudobinary alloy oxide system has a tetrahedral structure, and wherein a net negative fixed charge is formed at an interface between the semiconductor surface and the pseudobinary alloy oxide system so as to induce an accumulation layer in p-type silicon which provides electrical field induced surface passivation to the semiconductor surface.

* * * * *

UNITED STATES PATENT AND TRADEMARK OFFICE
CERTIFICATE OF CORRECTION

PATENT NO. : 7,659,475 B2
APPLICATION NO. : 10/871531
DATED : February 9, 2010
INVENTOR(S) : Agostinelli et al.

It is certified that error appears in the above-identified patent and that said Letters Patent is hereby corrected as shown below:

On the Title Page:

The first and sole Notice should read --

Subject to any disclaimer, the term of this patent is extended or adjusted under 35 U.S.C. 154(b) by 1061 days.

| Issued Patent Column | Line | 1. **Description of Discrepancy** |
|---|---|---|
| On the Title Page (Item 56) | 6-7 | Under Other Publications, change "SiO2-Al203" to --$SiO_2$-$Al_2O_3$--. |
| On the Title Page (Item 56) | 7 | Under Other Publications, change "Aergels" to --Aerogels--. |
| On the Title Page (Item 56) Page 2 | 2 | Under Other Publications, change "USLI" to --ULSI--. |
| 2 | 29 (Approx.) | Change "$V_{fb}$=$\Phi_{Dms}$–$Q_f/C_{\alpha x}$" --$V_{fb} = \Phi_{ms} – Q_f/C_{\alpha x}$--. |
| 7 | 34 | Change "A1CH3*" to --$AlCH_3$*--. |
| 7 | 34 | Change "rehydroxilates" to --rehydroxylates--. |
| 10 | 42 | Change "$(TiO_2)_1$-x" to --$(TiO_2)_{1-x}$--. |
| 13 | 59 (Approx.) | Change "Df=5-6x1011 cm-2." to --$D_f$=5-6x$10^{11}$ $cm^{-2}$.--. |

Signed and Sealed this

Twenty-eighth Day of September, 2010

David J. Kappos

David J. Kappos
*Director of the United States Patent and Trademark Office*

| | | |
|---|---|---|
| 13 | 66 | Change “(Al2O3)x(TiO2)1-x” to --$(Al_2O_3)x(TiO_2)_{1-x}$--. |
| 13 | 67 | Change “Al2O3” to --$Al_2O_3$--. |
| 14 | 1 | Change “Al2O3” to --$Al_2O_3$--. |
| 15 | 2 | Change “quality” to --high-quality--. |
| 15 | 13 (Approx.) | Change “wafer” to --wafers--. |
| 15 | 20 | Change “typed).” to --type).--. |
| 16 | 9 (Approx.) | Change “$9_x$” to --9--. |
| 18 | 6 | In Claim 19, change “pyrolized.” to --pyrolyzed.--. |